United States Patent
Dunn

(10) Patent No.: US 9,629,287 B2
(45) Date of Patent: Apr. 18, 2017

(54) SYSTEM FOR USING CONSTRICTED CONVECTION WITH CLOSED LOOP COOLING SYSTEM AS THE CONVECTION PLATE

(71) Applicant: Manufacturing Resources International, Inc., Alpharetta, GA (US)

(72) Inventor: William Dunn, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 0 days.

(21) Appl. No.: 15/180,968

(22) Filed: Jun. 13, 2016

(65) Prior Publication Data

US 2016/0302331 A1    Oct. 13, 2016

Related U.S. Application Data

(63) Continuation of application No. 14/803,848, filed on Jul. 20, 2015, now Pat. No. 9,370,127, which is a continuation of application No. 14/508,767, filed on Oct. 7, 2014, now Pat. No. 9,089,079, which is a continuation of application No. 13/937,777, filed on Jul. 9, 2013, now Pat. No. 8,854,572, which is a continuation of application No. 13/605,530, filed on Sep. 6, 2012, now Pat. No. 8,482,695, which is a continuation of application No. 12/620,330, filed on Nov. 17, 2009, now Pat. No. 8,274,622, and a continuation-in-part of application No. 12/234,307, filed on Sep. 19, 2008, now Pat. No. 8,767,165, said application No. 12/620,330 is a continuation-in-part of application No. 12/234,360, filed on Sep. 19, 2008, which is a continuation-in-part of application No.

(Continued)

(51) Int. Cl.
G02F 1/1333 (2006.01)
H05K 7/20 (2006.01)
G02F 1/1335 (2006.01)

(52) U.S. Cl.
CPC ..... *H05K 7/20954* (2013.01); *G02F 1/133308* (2013.01); *G02F 1/133385* (2013.01); *G02F 1/133603* (2013.01); *G02F 1/133615* (2013.01); *H05K 7/202* (2013.01); *H05K 7/20127* (2013.01); *H05K 7/20136* (2013.01); *H05K 7/20145* (2013.01); *H05K 7/20163* (2013.01); *H05K 7/20209* (2013.01); *H05K 7/20972* (2013.01); *G02F 2201/36* (2013.01)

(58) Field of Classification Search
None
See application file for complete search history.

(56) References Cited

U.S. PATENT DOCUMENTS 6,007,205 A * 12/1999 Fujimori ............... G03B 21/16
348/E9.027

* cited by examiner

*Primary Examiner* — Richard Kim
(74) *Attorney, Agent, or Firm* — Standley Law Group LLP

(57) ABSTRACT

An electronic display assembly is disclosed herein. An electronic display may be positioned within a housing where the display is cooled by a combination of airflows. A closed loop of isolated gas may be used with an open loop of ambient air which passes through the housing in order to cool the display. Preferably, the closed loop of isolated gas cools the front surface of the display while the open loop of ambient air cools the rear surface of the display. Preferably, the closed loop of isolated gas is not permitted to mix with the open loop of ambient air.

23 Claims, 3 Drawing Sheets

Related U.S. Application Data

12/237,365, filed on Sep. 24, 2008, now Pat. No. 8,879,042, which is a continuation-in-part of application No. 12/411,925, filed on Mar. 26, 2009, now Pat. No. 8,854,595, which is a continuation-in-part of application No. 12/235,200, filed on Sep. 22, 2008, now abandoned, which is a continuation-in-part of application No. 12/556,029, filed on Sep. 9, 2009, now Pat. No. 8,373,841.

(60) Provisional application No. 61/115,333, filed on Nov. 17, 2008, provisional application No. 61/033,064, filed on Mar. 3, 2008, provisional application No. 61/053,713, filed on May 16, 2008, provisional application No. 61/057,599, filed on May 30, 2008, provisional application No. 61/039,454, filed on Mar. 26, 2008, provisional application No. 61/076,126, filed on Jun. 26, 2008, provisional application No. 61/095,615, filed on Sep. 9, 2008.

SYSTEM FOR USING CONSTRICTED CONVECTION WITH CLOSED LOOP COOLING SYSTEM AS THE CONVECTION PLATE

CROSS-REFERENCE TO RELATED APPLICATIONS

This application is a continuation of U.S. application Ser. No. 14/803,848 filed on Jul. 20, 2015, now U.S. Pat. No. 9,370,127 issued Jun. 14, 2016. U.S. application Ser. No. 14/803,848 is a continuation of U.S. application Ser. No. 14/508,767 filed on Oct. 7, 2014, now U.S. Pat. No. 9,089,079 issued Jul. 21, 2015. U.S. application Ser. No. 14/508,767 is a continuation of U.S. application Ser. No. 13/937,777 filed on Jul. 9, 2013, now U.S. Pat. No. 8,854,572 issued Oct. 7, 2014. U.S. application Ser. No. 13/937,777 is a continuation of U.S. application Ser. No. 13/605,530 filed on Sep. 6, 2012, now U.S. Pat. No. 8,482,695 issued Jul. 9, 2013. U.S. application Ser. No. 13/605,530 is a continuation of U.S. application Ser. No. 12/620,330 filed on Nov. 17, 2009, now U.S. Pat. No. 8,274,622 issued Sep. 25, 2012, which is a non-provisional application of U.S. Application No. 61/115,333 filed Nov. 17, 2008. U.S. application Ser. No. 12/620,330 is also continuation-in-part of U.S. application Ser. No. 12/411,925 filed Mar. 26, 2009, now U.S. Pat. No. 8,854,595 issued Oct. 7, 2014, which is a non-provisional application of U.S. Provisional Application No. 61/039,454 filed Mar. 26, 2008. U.S. application Ser. No. 12/620,330 is also a continuation-in-part of U.S. application Ser. No. 12/556,029 filed Sep. 9, 2009, now U.S. Pat. No. 8,373,841 issued Feb. 12, 2013, which is a non-provisional application of U.S. Provisional Application No. 61/095,615 filed Sep. 9, 2008. U.S. application Ser. No. 12/620,330 is also a continuation-in-part of U.S. application Ser. No. 12/234,307 filed Sep. 19, 2008, now U.S. Pat. No. 8,767,165 issued Jul. 1, 2014, which is a non-provisional application of U.S. Provisional Application No. 61/033,064 filed Mar. 3, 2008. U.S. application Ser. No. 12/620,330 is also a continuation-in-part of U.S. application Ser. No. 12/234,360 filed Sep. 19, 2008, which is a non-provisional application of U.S. Provisional Application No. 61/053,713 filed May 16, 2008. U.S. application Ser. No. 12/620,330 is also a continuation-in-part of U.S. application Ser. No. 12/237,365, filed Sep. 24, 2008, now U.S. Pat. No. 8,879,042 issued Nov. 4, 2014, which is a non-provisional application of U.S. Provisional Application No. 61/057,599 filed May 30, 2008. U.S. application Ser. No. 12/620,330 is also a continuation-in-part of U.S. application Ser. No. 12/235,200 filed Sep. 22, 2008, which is a non-provisional application of U.S. Provisional Application No. 61/076,126 filed Jun. 26, 2008. All aforementioned applications are hereby incorporated by reference in their entirety as if fully cited herein.

TECHNICAL FIELD

Exemplary embodiments generally relate to cooling systems for electronic displays.

BACKGROUND OF THE ART

Conductive and convective heat transfer systems for electronic displays are known. These systems of the past generally attempt to remove heat from the electronic components in a display through as many sidewalls of the display as possible. While such heat transfer systems have enjoyed a measure of success in the past, improvements to displays require even greater cooling capabilities.

In particular, cooling devices for electronic displays of the past have generally used convective heat dissipation systems that function to cool an entire interior of the display by one or more fans and fins, for example. By itself, this is not adequate in many climates, especially when radiative heat transfer from the sun through a display window becomes a major factor. In many applications and locations 200 Watts or more of power through such a display window is common. Additionally, modern applications call for larger displays than previous applications. For example, some outdoor applications call for forty-seven inch screens and above. With increased heat production from the larger screens and radiative heat transfer from the sun through the display window, more efficient and powerful heat dissipation systems are required.

SUMMARY OF THE EXEMPLARY EMBODIMENTS

A large fluctuation in temperature is common in the devices of the past. Such temperature fluctuation adversely affects the electronic components in these devices. Whereas the systems of the past attempted to remove heat only through the non-display sides and rear components of the enclosure surrounding the electronic display components, a preferred embodiment causes convective heat transfer from the face of the display as well. By the aspects described below, exemplary embodiments have made consistent cooling possible for electronic displays having screens of sizes greater than or equal to twelve inches. For example, cooling of a 55 inch screen can be achieved, even in extremely hot climates. Greater cooling capabilities are provided by the device and method described and shown in more detail below.

An exemplary embodiment relates to an isolated gas cooling system and a method for cooling an electronic display. An exemplary embodiment includes an isolated gas cooling chamber. The gas cooling chamber is preferably a closed loop which includes a first gas chamber comprising a transparent anterior plate and a second gas chamber comprising a cooling plenum.

The first gas chamber is anterior to and coextensive with the viewable face of the electronic display surface. The transparent anterior plate may be set forward of the electronic display surface by spacers defining the depth of the first gas chamber. A cooling chamber fan, or equivalent means, maybe located within the cooling plenum. The fan may be used to propel gas around the isolated gas cooling chamber loop. As the gas traverses the first gas chamber it contacts the electronic display surface, absorbing heat from the surface of the display. Because the gas and the relevant surfaces of the first gas chamber are transparent, the image quality would preferably remain excellent. After the gas has traversed the transparent first gas chamber, the gas may be directed into the rear cooling plenum.

In order to cool the gas in the plenum, external convective or conductive means may be employed. In at least one embodiment, an external fan unit may also be included within the housing of the display. The external fan unit may be positioned to provide a flow of ingested air over the external surfaces of the plenum. The heated air in the housing may exit the housing as exhaust.

The two chambers of the closed loop plenum encircle the electronic display. Within electronic displays is typically a backlight, especially in liquid crystal displays (LCD). The backlight can be a significant source of heat for the electronic display. Exemplary embodiments position the backlight sufficiently close to the wall of the cooling plenum so that convective heat transfer from the backlight can be increased. The external fan may force air between the plenum and the backlight or air may be pulled from the top of the display using an additional fan unit. Alternatively, a combination of both fans may be employed.

The foregoing and other features and advantages of the present invention will be apparent from the following more detailed description of the particular embodiments of the invention, as illustrated in the accompanying drawings.

BRIEF DESCRIPTION OF THE DRAWINGS

A better understanding of an exemplary embodiment will be obtained from a reading of the following detailed description and the accompanying drawings wherein identical reference characters refer to identical parts and in which.

DETAILED DESCRIPTION

Figure 1:
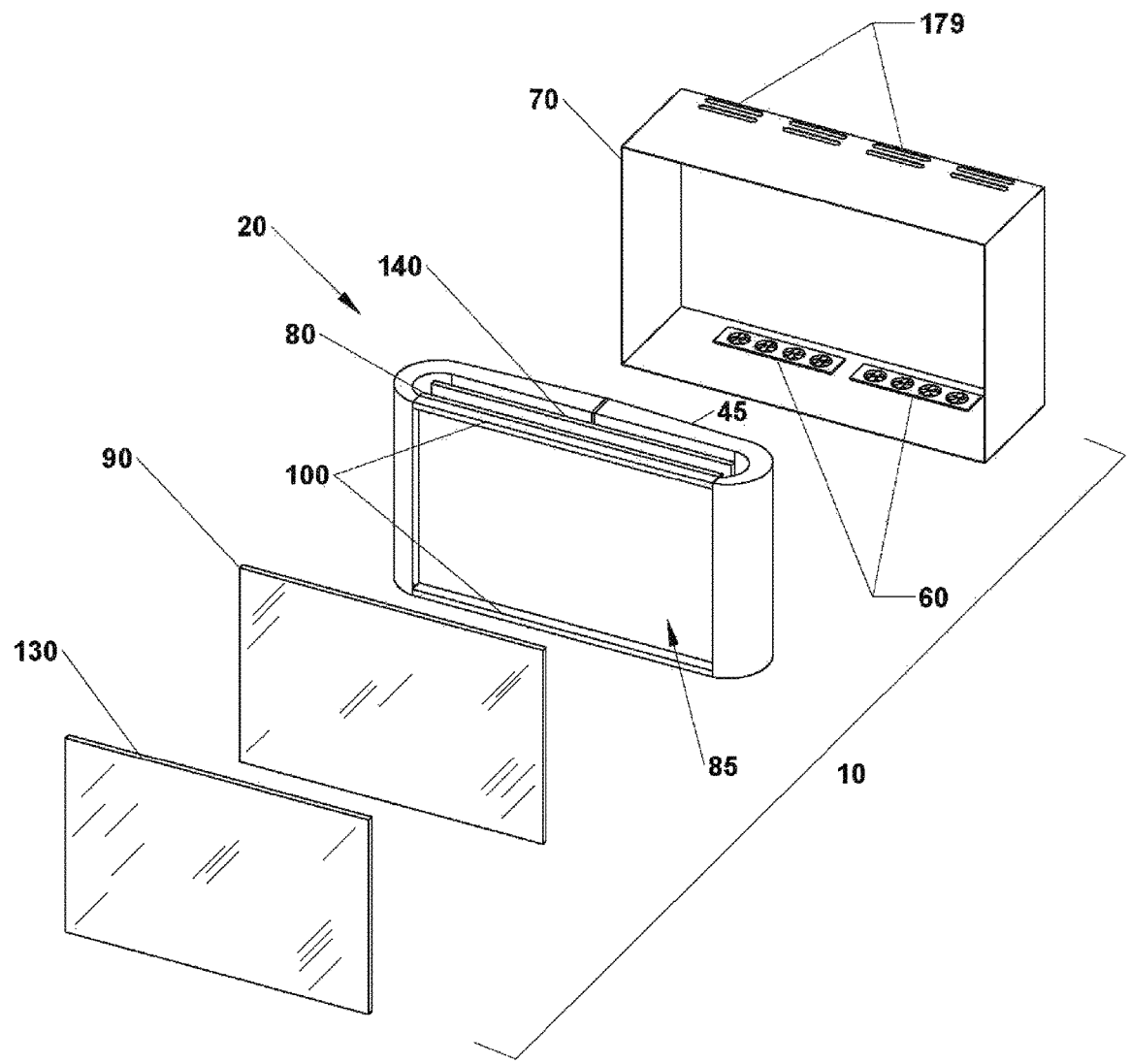
FIG. 1 is an exploded perspective view of an exemplary embodiment showing components of the isolated gas cooling system.

FIG. 1 is an exploded view of an exemplary embodiment of the closed loop cooling system. This system is fully described in co-pending U.S. application Nos. 61/033,064 and 61/053,713 herein incorporated by reference in their entirety.

It is to be understood that the disclosed embodiments includes the cooling of displays including, but not limited to LCDs. By way of example and not by way of limitation, the exemplary embodiments may be used in conjunction with displays selected from among LCD (including TFT or STN type), light emitting diode (LED), organic light emitting diode (OLED), field emitting display (FED), cathode ray tube (CRT), and plasma displays. Furthermore, embodiments may be used with displays of other types including those not yet discovered. In particular, it is contemplated that the exemplary embodiments may be well suited for use with full color, flat panel OLED displays. While the embodiments described herein are well suited for outdoor environments, they may also be appropriate for indoor applications (e.g., factory environments) where thermal stability of the display may be at risk.

An exemplary embodiment 10 of the electronic display and gas cooling system includes an isolated gas cooling chamber 20 contained within an electronic display housing 70. A narrow transparent first gas chamber may be defined by spacers 100 and transparent front plate 90. A second transparent front plate 130 may be laminated to front plate 90 to help prevent breakage of transparent plate 90. Cooling chamber 20 surrounds an electronic display 80 (in this case an LCD stack) and associated backlight panel 140 (although some embodiments may not require a backlight panel).

The gas cooling system 10 may include means for cooling gas contained within the cooling plenum 45. This means may include a fan 60 which may be positioned at the base of the display housing 70. The fan will force the cooler ingested air over at least one external surface of a posterior cooling plenum 45. If desired, an air conditioner (not shown) may also be utilized to cool the air which contacts the external surface of plenum 45. This air may be the same air that is forced between the backlight 145 and the surface of the plenum 45 in order to further cool the backlight 145.

Figure 2:
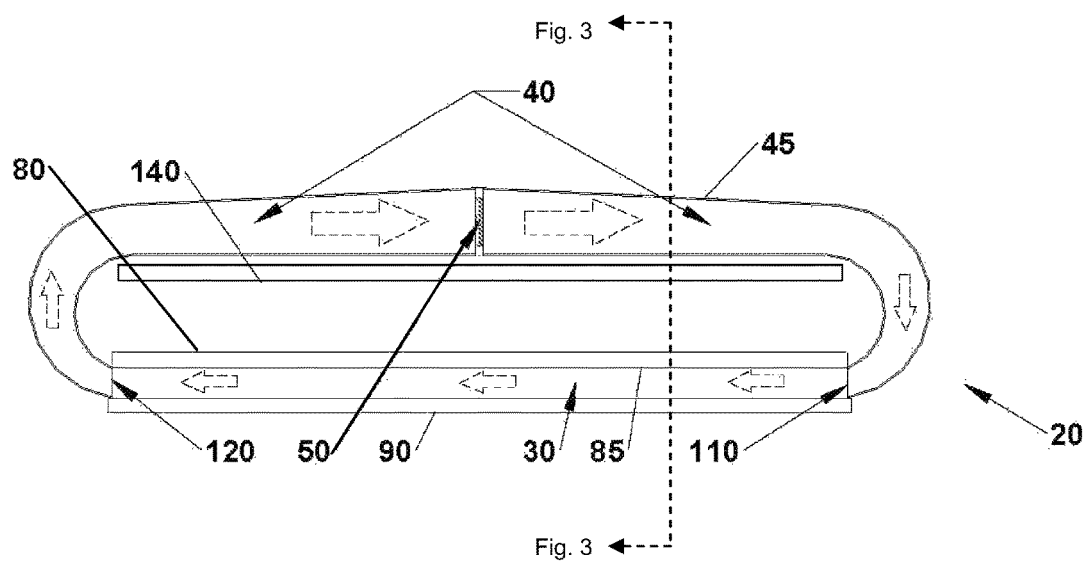
FIG. 2 is top sectional view of an exemplary embodiment of the cooling chamber.

Referring to FIG. 2, in at least one embodiment the isolated gas cooling chamber 20 comprises a closed loop which includes a first gas chamber 30 and a rear cooling chamber 40. The first gas chamber includes a transparent plate 90. The second gas chamber comprises a cooling plenum 45. The term "isolated gas" refers to the fact that the gas within the isolated gas cooling chamber 20 is essentially isolated from external air in the housing of the display. Because the first gas chamber 30 is positioned in front of the display image, the gas should be substantially free of dust or other contaminates that might negatively affect the display image.

The isolated gas may be almost any transparent gas, for example, normal air, nitrogen, helium, or any other transparent gas. The gas is preferably colorless so as not to affect the image quality. Furthermore, the isolated gas cooling chamber need not necessarily be hermetically sealed from the external air. It is sufficient that the gas in the chamber is isolated to the extent that dust and contaminates may not substantially enter the first gas chamber.

The first gas chamber 30 is in gaseous communication with the rear cooling chamber 40. A cooling chamber fan 50 may be provided within the posterior plenum 45. The cooling fan 50 may be utilized to propel gas around the isolated gas cooling chamber 20. The first gas chamber 30 includes at least one transparent plate 90 mounted in front of an electronic display surface 85. The transparent plate 90 may be set forward from the electronic display surface 85 by spacers 100. The spacing members 100 define the depth of the narrow channel passing in front of the electronic display surface 85. The spacing members 100 may be independent or alternatively may be integral with some other component of the device (e.g., integral with the front plate). The electronic display surface 85, the spacing members, and the transparent front plate 90 define a narrow first gas chamber 30. The chamber 30 is in gaseous communication with plenum 45 through entrance opening 110 and exit opening 120.

Figures 3A, 3B:
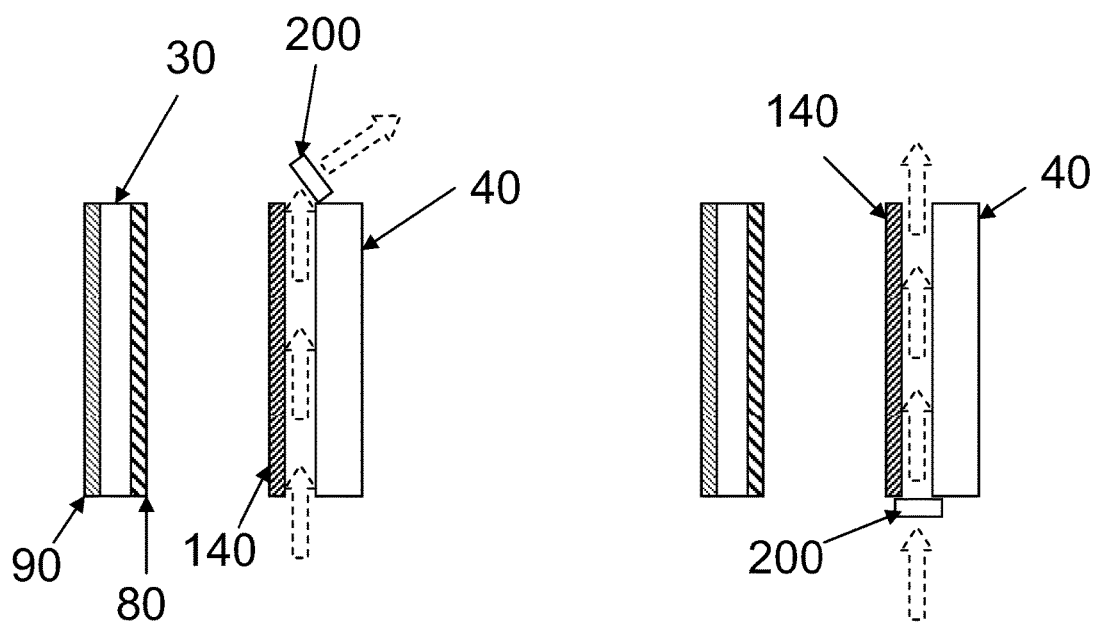
FIGS. 3A-3E are cross sectional views of exemplary embodiments using constricted convection cooling.

FIG. 3A shows a cross-sectional view of the section that is shown in FIG. 2. Towards the front of the display is the first gas chamber 30 which abuts against the electronic display 80. In front of the first gas chamber 30 is the transparent plate 90. Towards the rear of the display, the backlight 140 is placed in close proximity to the posterior rear cooling chamber 40. The close proximity of these two elements, in part, creates the constricted convection cooling of the backlight 140. One or more constricted convection fans 200 may be used to draw air between the backlight 140 and the rear cooling chamber 40. It has been found that forcing air through a smaller space increases the cooling abilities of the system. The distance between the backlight 140 and the rear cooling chamber 40 may vary depending on many factors, including but not limited to: the size of the display, the design of the backlight assembly, the desired operating environment, and the size and speed of the selected constricted convection fans. An ideal distance may be between 0.25 and 1.25 inches. Alternatively, an ideal distance may be between 0.33 and 2.5 inches. Larger distances may be preferable, depending at least upon the many factors listed above.

The backlight may comprise a printed circuit board (PCB) with a plurality of lights mounted to the side facing the electronic display 80. The lights in the backlight may be any one of the following: LED's, organic light emitting diodes (OLED), field emitting display (FED), light emitting polymer (LEP), or organic electro-luminescence (OEL) lights. In an exemplary embodiment, the backlight 140 would ideally have a low level of thermal resistance between the side facing the electronic display 80 and the side facing the cooling plenum. To accomplish this low level of thermal resistance, the backlight 140 may be built using metal printed circuit board (PCB) technology to further transfer heat away from the lights. The rear surface of the backlight 140 may also be metallic, or some other thermally conductive material, to further enhance the convective heat transferring properties. The surface may even have a plurality of surface features such as fins to further enhance the convective heat transferring properties. The constricted convection fan 200 may then send the warm air out of an exhaust 179 (shown in FIG. 1) so that it may exit the display housing entirely.

Figure 3C:
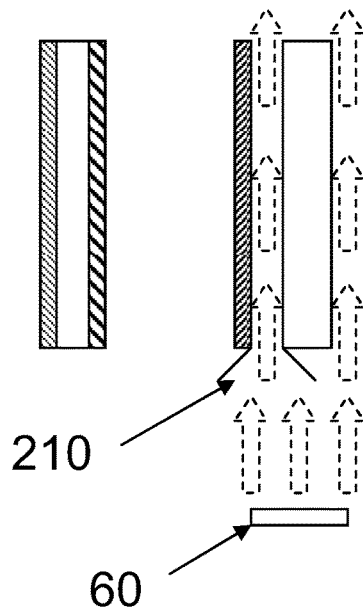

FIG. 3B shows another cross-sectional view of another embodiment for the constricted convection setup. In this embodiment, the constricted convection fan 200 is used to push air between the backlight 140 and the rear cooling chamber 40. FIG. 3C shows an embodiment without the constricted convection fan, but instead uses the fan 60 which draws air from outside the display housing. As noted above, this air may simply be ambient air or alternatively this air may come from a conditioning unit (not shown). To facilitate the flow of air between the backlight 140 and the rear cooling chamber 40, a guiding device 210 may be used.

Figure 3D:
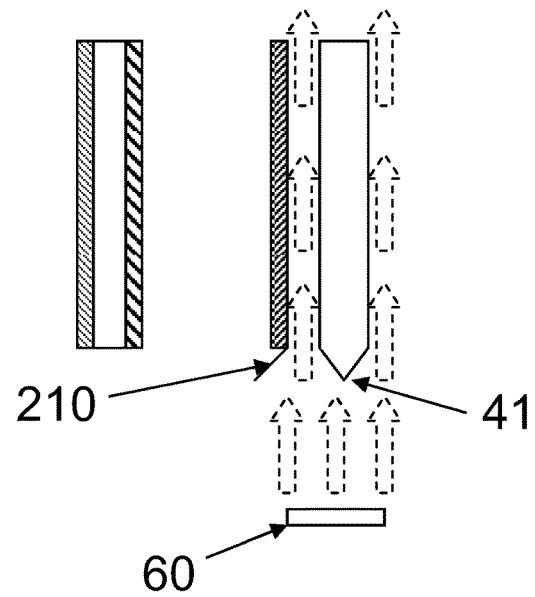
Figure 3E:
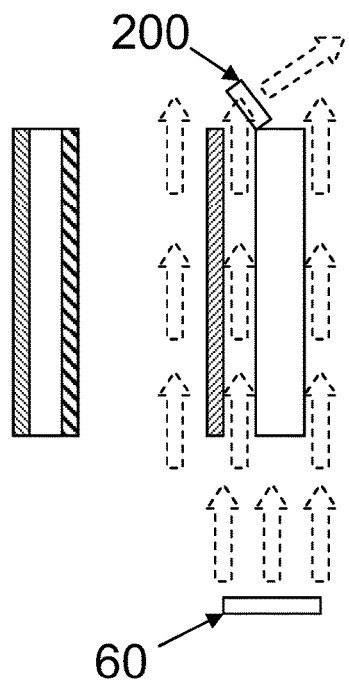

FIG. 3D shows another embodiment, where the rear cooling chamber 40 contains a guiding feature 41, which is used in combination with the guiding device 210 to facilitate the flow of air between the backlight and the cooling chamber. FIG. 3E shows another embodiment, where both the fan 60 and the constricted convection fan 200 is used. This embodiment could also utilize a version of the guiding devices shown in FIGS. 3C and 3D.

While the display is operational, the fan 60 and the constricted convection fan 200 may run continuously. However, if desired, a temperature sensor (not shown) and a switch or microcontroller (not shown) may be incorporated within the electronic display. This effective thermostat may be used to detect when temperatures have reached a predetermined threshold value. In such a case, the various fans may be selectively engaged when the temperature in the display reaches a predetermined value. Predetermined thresholds may be selected and the system may be configured with a thermostat (not shown) to advantageously keep the display within an acceptable temperature range. This would save on both energy costs as well as the useful lifetime of the devices.

An optional air filter (not shown) may be employed within the plenum to assist in preventing contaminates and dust from entering the first gas chamber 30. An air filter could also be used to prevent fan 60 from drawing in particulates from either the surrounding environment or the conditioning unit.

It should be noted, that some embodiments may not use display technology that requires a backlight. For these types of displays, the electronic display 80 would be placed anterior to the rear cooling chamber 40 (rather than the backlight 140). For example, an OLED may be placed anterior to the rear cooling chamber 40 so that cooling air could be forced between the posterior surface of the OLED and the rear cooling chamber 40.

Having shown and described the preferred embodiments, those skilled in the art will realize that many variations and modifications may be made to affect the embodiments and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

I claim:

1. An electronic display assembly comprising:
an electronic display housing;
a gas-containing closed loop gas cooling chamber located within the electronic display housing;
an electronic display positioned within the electronic display housing but outside of the closed loop gas cooling chamber; and
an open loop ambient air pathway through the electronic display housing;
wherein the electronic display is coolable by a combination of gas circulation within the closed loop gas cooling chamber and ambient air flow through the open loop ambient air pathway in the electronic display housing.

2. The electronic display assembly of claim 1 wherein:
the closed loop gas cooling chamber and the open loop ambient air pathway are positioned such that gas circulation within the closed loop gas cooling chamber will cool a front surface of the electronic display while the ambient air flow will cool a rear surface of the electronic display.

3. The electronic display assembly of claim 2 wherein:
the rear surface of the electronic display comprises the rear surface of an LED backlight.

4. The electronic display assembly of claim 1 wherein:
the gas within the closed loop gas cooling chamber is isolated from the open loop of ambient air.

5. The electronic display assembly of claim 1 wherein:
the closed loop gas cooling chamber and the ambient air pathway are configured such that gas circulation within the gas cooling chamber will occur in a direction that is substantially perpendicular to the direction that ambient air will flow through the electronic display housing.

6. The electronic display assembly of claim 1 wherein:
the closed loop of gas cooling chamber forms a continuous loop and the open loop ambient air pathway passes through the loop.

7. The electronic display assembly of claim 1 wherein:
the closed loop gas cooling chamber is configured such that gas circulation therein will occur substantially horizontally, while the open loop ambient air pathway is configured such that ambient air flow through the electronic display housing will occur substantially vertically.

8. The electronic display assembly of claim 1 wherein:
the closed loop gas cooling chamber is partially defined by a sealed rear plenum that prevents ambient air from entering the plenum.

9. The electronic display assembly of claim 8 further comprising:
one or more electronic devices for operating the electronic display positioned within the sealed plenum.

10. The electronic display assembly of claim 1 wherein:
the electronic display is selected from the group consisting of a liquid crystal display, a light emitting diode display, an organic light emitting diode display, a field emitting display, a cathode ray tube display, and a plasma display.

11. The electronic display assembly of claim 1 further comprising:

a gas-circulating fan for circulating the gas within the closed loop gas cooling chamber, and a fan for producing a flow of ambient air through the open loop ambient air pathway in the electronic display housing.

12. An electronic display assembly comprising:
a housing;
a liquid crystal display (LCD) positioned within the housing and having a backlight;
wherein the electronic display is coolable by a combination of a closed loop of isolated gas which circulates within the housing and an open loop of ambient air which passes through the housing and along the backlight.

13. The electronic display assembly of claim 12 wherein:
the isolated gas will cool a front surface of the LCD.

14. The electronic display assembly of claim 12 further comprising:
a rear cooling chamber positioned behind the LCD and containing the closed loop of isolated gas; and
wherein the open loop ambient air will contact an exterior surface of the chamber, but is not permitted to enter the chamber.

15. The electronic display assembly of claim 12 further comprising:
one or more electronic components for driving the LCD positioned within the rear cooling chamber.

16. The electronic display assembly of claim 12 wherein:
the open loop of ambient air will contact an exterior surface of the rear cooling chamber while the closed loop of isolated gas will contact an interior surface of the rear cooling chamber.

17. The electronic display assembly of claim 12 wherein:
the intended direction of closed loop isolated gas flow is substantially perpendicular to the intended direction of open loop of ambient air flow.

18. An electronic display assembly comprising:
a housing;
an electronic display positioned within the housing;
a rear cooling chamber positioned behind the electronic display and containing an electrical component which is electrically connected to the electronic display;
a front surface on the electronic display which faces an intended viewer and a rear surface on the electronic display which opposes the front surface;
wherein the front surface of the electronic display is coolable by a closed loop of isolated gas and the rear surface of the electronic display is coolable by an open loop of ambient air.

19. The electronic display assembly of claim 18 wherein:
the open loop of ambient air is prohibited from mixing with the closed loop of isolated gas when it passes through the housing.

20. The electronic display assembly of claim 18 wherein:
the open loop of ambient air will pass between the rear surface of the electronic display and an exterior surface of the rear cooling chamber.

21. An electronic display assembly comprising:
an electronic display housing;
a closed loop of cooling gas adapted for circulation within the electronic display housing;
an open loop ambient air pathway through the electronic display housing; and
an electronic display positioned within the electronic display housing such that the electronic display is isolated from the closed loop of cooling gas but contactable by ambient air flowing through the open loop ambient air pathway;
wherein the electronic display is coolable by a combination of closed loop cooling gas circulation within the electronic display housing, and ambient air flow through the open loop ambient air pathway in the electronic display housing.

22. The electronic display assembly of claim 21 wherein:
the closed loop of cooling gas is isolated within a continuous loop gas cooling chamber, and the open loop ambient air pathway is configured to direct the ambient air over an exterior surface of the gas cooling chamber when it flows through the electronic display housing.

23. The electronic display assembly of claim 22 further comprising:
a fan located within the electronic display housing, the fan configured and oriented to move air located within the housing between a surface of the continuous loop gas cooling chamber and a rear surface of the electronic display.

* * * * *

UNITED STATES PATENT AND TRADEMARK OFFICE
CERTIFICATE OF CORRECTION

PATENT NO. : 9,629,287 B2
APPLICATION NO. : 15/180968
DATED : April 18, 2017
INVENTOR(S) : William Dunn Page 1 of 1

It is certified that error appears in the above-identified patent and that said Letters Patent is hereby corrected as shown below:

On the Title Page

Item (63):
Please delete all of the text in Related U.S. Application Data items (63) and (60), and insert
-- Continuation of application No. 14/803,848 filed on Jul. 20, 2015, now Pat. No. 9,370,127, which is a continuation of application No. 14/508,767 filed on Oct. 7, 2014, now Pat. No. 9,089,079, which is a continuation of application No. 13/937,777 filed on Jul. 9, 2013, now Pat. No. 8,854,572, which is a continuation of application No. 13/605,530 filed on Sep. 6, 2012, now Pat. No. 8,482,695, which is a continuation of application No. 12/620,330 filed on Nov. 17, 2009, now Pat. No. 8,274,622, which is a non-provisional application of application No. 61/115,333 filed on Nov. 17, 2008. Application No. 12/620,330 is also continuation-in-part of application No. 12/411,925 filed on Mar. 26, 2009, now Pat. No. 8,854,595, which is a non-provisional application of application No. 61/039,454 filed on Mar. 26, 2008. Application No. 12/620,330 is also a continuation-in-part of application No. 12/556,029 filed on Sep. 9, 2009, now Pat. No. 8,373,841, which is a non-provisional application of application No. 61/095,615 filed on Sep. 9, 2008. Application No. 12/620,330 is also a continuation-in-part of application No. 12/234,307 filed on Sep. 19, 2008, now Pat. No. 8,767,165, which is a non-provisional application of application No. 61/033,064 filed on Mar. 3, 2008. Application No. 12/620,330 is also a continuation-in-part of application No. 12/234,360 filed on Sep. 19, 2008, which is a non-provisional application of application No. 61/053,713 filed on May 16, 2008. Application No. 12/620,330 is also a continuation-in-part of application No. 12/237,365, filed on Sep. 24, 2008, now Pat. No. 8,879,042, which is a non-provisional application of application No. 61/057,599 filed on May 30, 2008. Application No. 12/620,330 is also a continuation-in-part of application No. 12/235,200 filed on Sep. 22, 2008, which is a non-provisional application of application No. 61/076,126 filed on Jun. 26, 2008.
--

Signed and Sealed this
Thirtieth Day of May, 2017

Michelle K. Lee
*Director of the United States Patent and Trademark Office*